(12) United States Patent
Higuchi

(10) Patent No.: US 6,930,880 B2
(45) Date of Patent: Aug. 16, 2005

(54) ELECTRONIC COMPONENT SUPPORT STRUCTURE

(75) Inventor: Eiji Higuchi, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 173 days.

(21) Appl. No.: 10/639,641

(22) Filed: Aug. 13, 2003

(65) Prior Publication Data

US 2004/0042165 A1 Mar. 4, 2004

(30) Foreign Application Priority Data

Aug. 27, 2002 (JP) ........................................ 2002-246206

(51) Int. Cl.[7] .............................................. H05K 5/00
(52) U.S. Cl. ..................................................... 361/679
(58) Field of Search ........................................ 361/679

(56) References Cited

U.S. PATENT DOCUMENTS 5,353,201 A 10/1994 Maeda
6,390,320 B2 * 5/2002 Hurst et al. .................. 220/241
6,814,592 B1 * 11/2004 Stahl ........................... 439/108

FOREIGN PATENT DOCUMENTS

| EP | 1176669 | 1/2002 |
|---|---|---|
| JP | 2002185165 | 6/2002 |

* cited by examiner

*Primary Examiner*—Yean-Hsi Chang
(74) *Attorney, Agent, or Firm*—Greenblum & Bernstein, P.L.C.

(57) ABSTRACT

An electronic component support structure is provided for preventing vibrational movement and rattling of an electronic component installed within a component receptacle. The component receptacle includes a sidewall having first and second flexible fingers formed therein at predetermined positions. The first flexible fingers are inwardly and outwardly flexible and include inwardly extending hook portions for engaging an upper surface of an electronic component. The second flexible fingers are inwardly and outwardly flexible and include inwardly extending lip portions for engaging lateral surfaces of an electronic component.

20 Claims, 5 Drawing Sheets

ELECTRONIC COMPONENT SUPPORT STRUCTURE

BACKGROUND OF THE INVENTION

1. Field of the Invention

The invention relates to a rattle suppressing support structure for an electrical component, and particularly to a support structure capable of preventing vibrational movement and rattling of an electronic component installed within a receptacle on an automotive junction board.

2. Description of the Related Art

As illustrated in FIGS. 6A and 6B, a conventional automotive junction board 1 is provided with a receptacle 2 in the form of an upwardly extending container structure into which an electrical component 3, such as a condenser or similar device, can be installed. Receptacle 2 includes hooks 5 that extend inwardly from the upper edge of the receptacle sidewall at specific locations, and two ribs 4 formed at specific locations on the inner surfaces of oppositely facing sidewalls. Hooks 5 are pushed outward as a component 3 is pressed down into receptacle 2. Once component 3 is fully installed within receptacle 2, hooks 5 press downward against the upper surface of component 3 to secure component 3 in receptacle 2, while ribs 4 apply pressure to two opposing lateral sides of component 3 to prevent rattling and noise generation.

However, ribs 4 must necessarily be formed to extend inwardly from the sidewalls far enough that they securely press against component 3, regardless of the size of the opening between the opposing sidewalls of receptacle 2. Accordingly, ribs 4 must protrude a relatively large distance "L" as shown in FIGS. 6A and 6B, thus increasing the amount of pressure required to press component 3 into receptacle 2, and making the junction board assembly process more difficult.

SUMMARY OF THE INVENTION

The present invention has been made in view of the above-described problems. Accordingly, it is an object of the present invention to provide a support structure capable of holding and maintaining an electronic component in a non-rattling condition, and to improve the junction board assembly process.

According to one aspect of the present invention, there is provided an electronic component support structure including a component receptacle having a sidewall extending from a bottom surface of a synthetic resin junction board to form an inner space configured to contain an electrical component inserted therein. The support structure also includes a plurality of first flexible fingers which are each formed by two slits provided at predetermined positions in the sidewall of the component receptacle. A free end of each of the first flexible fingers is inwardly and outwardly flexible, and includes an inwardly extending hook portion for pressing against an upper surface of an electronic component inserted into the component receptacle. The support structure also includes a plurality of second flexible fingers which are each formed by a U-shaped cutout portion provided at a predetermined position in the sidewall of the component receptacle. A free end of each of the second flexible fingers is inwardly and outwardly flexible, and includes an inwardly extending lip portion for pressing against a lateral surface of an electronic component inserted into the component receptacle.

The ability of the first flexible fingers, each including a hook portion for holding the electrical component within the receptacle, to flex in inward and outward directions has the effect of reducing the pressure required to press the electronic component into the receptacle. Moreover, the ability of the second flexible fingers, each including a lip portion for preventing the loose movement of the electronic component in the receptacle, to flex in inward and outward directions, also reduces the pressure required to press the electronic component into the receptacle.

Under conditions in which the dimensions of the receptacle fluctuate as a result of environmental factors, which may include changes in temperature, the dimensional fluctuation can be accounted for by the elasticity of the second flexible fingers without adversely affecting the ability of the fingers to prevent the electronic component from rattling and generating noise within the receptacle. Moreover, the electronic component is securely maintained within the receptacle by the hook portions of the first flexible fingers pressing down on the upper surface of the electronic component.

According to a further aspect of the present invention, the sidewall of the component receptacle includes four sidewall portions forming a rectangular structure, each of the sidewall portions including at least one of the second flexible fingers formed therein. Further, two opposed sidewall portions include at least one of the first flexible fingers formed therein.

The provision of a second flexible finger in each sidewall portion of the rectangular receptacle, each second flexible finger including a rattle preventing lip portion, creates a structure able to suppress vibration and rattling movement of the electronic component along the horizontal axis.

According to a further aspect of the present invention, the free ends of the first flexible fingers are upper free ends from which the hook portions inwardly extend. Further, the free ends of the second flexible fingers are lower free ends from which the lip portions inwardly extend.

According to a further aspect of the present invention, the inwardly extending hook portions of the first flexible fingers maintain the electronic component in the component receptacle. Further, the inwardly extending lip portions of the second flexible fingers inhibit lateral movement of the electronic component in the component receptacle.

According to a further aspect of the present invention, the bottom surface of the synthetic resin junction board includes at least one rib portion for engaging a lower surface of an electronic component in the component receptacle.

According to another aspect of the present invention, there is provided an electronic component support structure including a component receptacle having a sidewall extending from a bottom surface to form an inner space configured to contain an electrical component inserted therein. The support structure also includes at least one first flexible finger provided at a predetermined position in the sidewall of the component receptacle. A free end of the at least one first flexible finger is inwardly and outwardly flexible, and includes an inwardly extending hook portion for engaging an upper surface of an electronic component inserted into the component receptacle. The support structure also includes at least one second flexible finger provided at a predetermined position in the sidewall of the component receptacle. A free end of the at least one second flexible finger is inwardly and outwardly flexible, and includes an inwardly extending lip portion for engaging a lateral surface of an electronic component inserted into the component receptacle.

According to a further aspect of the present invention, the sidewall of the component receptacle includes four sidewall portions forming a rectangular structure, each of the sidewall portions including at least one of the at least one second flexible fingers formed therein. Further, two opposed sidewall portions of the sidewall each include at least one of the at least one first flexible fingers formed therein.

According to a further aspect of the present invention, the free end of the at least one first flexible finger is an upper free end from which the hook portion inwardly extends. Further, the free end of the at least one second flexible finger is a lower free end from which the lip portion inwardly extends.

According to a further aspect of the present invention, the inwardly extending hook portion of the at least one first flexible finger maintains the electronic component in the component receptacle. Further, the inwardly extending lip portion of the at least one second flexible finger inhibits lateral movement of the electronic component in the component receptacle.

According to a further aspect of the present invention, the bottom surface from which the sidewall extends includes at least one rib portion for engaging a lower surface of an electronic component in the component receptacle.

According to a further aspect of the present invention, a plurality of the at least one first flexible fingers are provided at predetermined positions along the sidewall. Further, a plurality of the at least one second flexible fingers are provided at predetermined positions along the sidewall.

According to a further aspect of the present invention, the at least one first flexible finger is formed by two slits extending from a top edge of the sidewall. Further, the at least one second flexible finger is formed by a U-shaped cutout portion extending from a bottom edge of the sidewall.

BRIEF DESCRIPTION OF THE DRAWINGS

The above, and other objects, features and advantages of the present invention will be made apparent from the following description of the preferred embodiment, given as nonlimiting examples, with reference to the accompanying drawings in which.

DETAILED DESCRIPTION OF THE PREFERRED EMBODIMENTS

The particulars shown herein are by way of example and for purposes of illustrative discussion of the embodiment of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The following will describe an embodiment of the invention with reference to the drawings.

Figure 1:
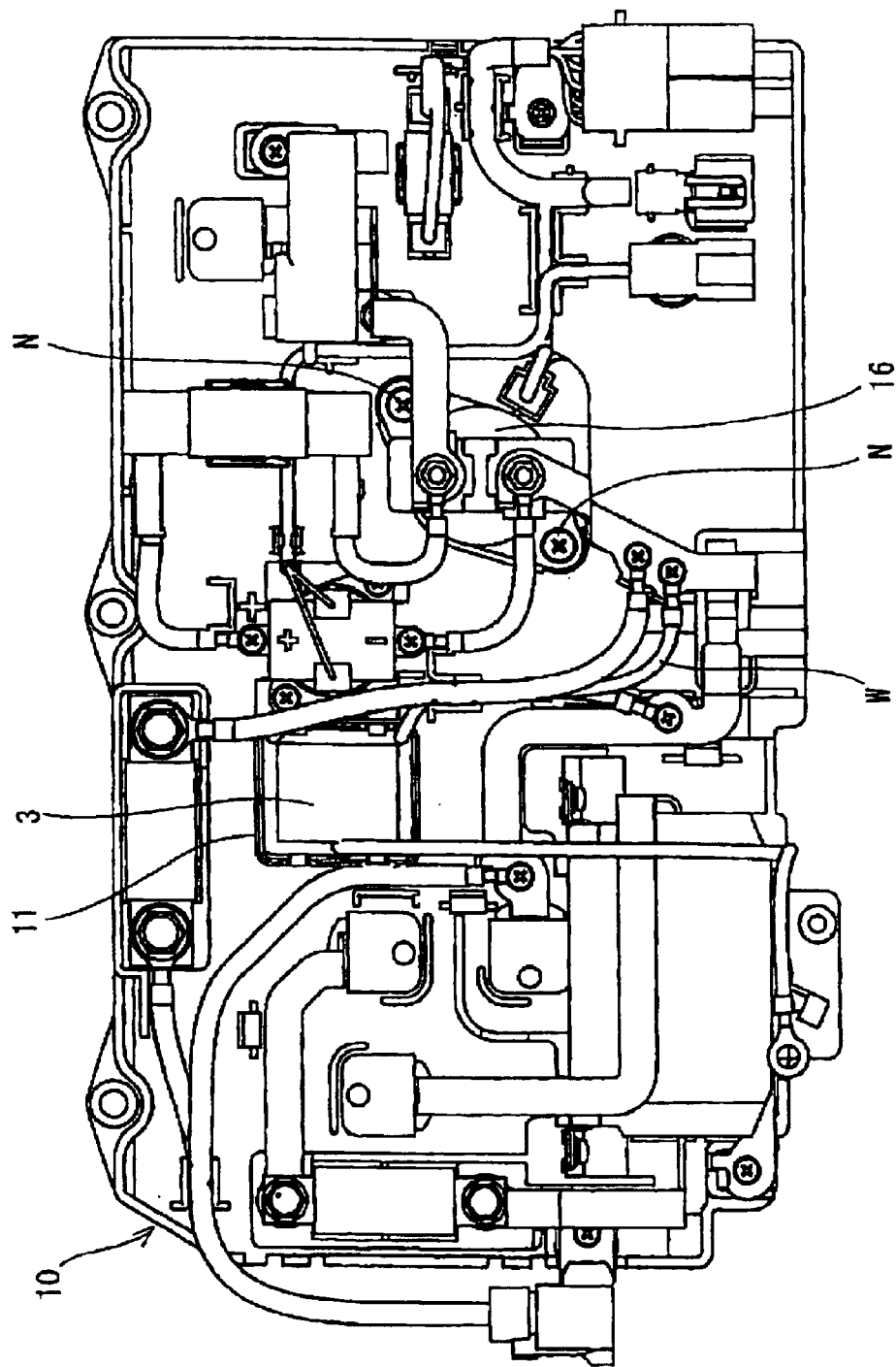
FIG. 1 is a plan view of a junction board incorporating an embodiment of the invention.

FIG. 1 illustrates a junction board 10 to which electronic components 3 and 16 are installed and interconnected by a lead wire w. The junction board 10 may be made of any suitable material, such as a synthetic resin. For example, a heavier electronic component in a main power circuit, such as a large capacity component 16, may be attached to junction board 10 in any suitable manner, such as by screws N. A lighter weight component 3, which may be any suitable type of component, such as a condenser, is installed into and supported by a receptacle 11.

Figure 2:
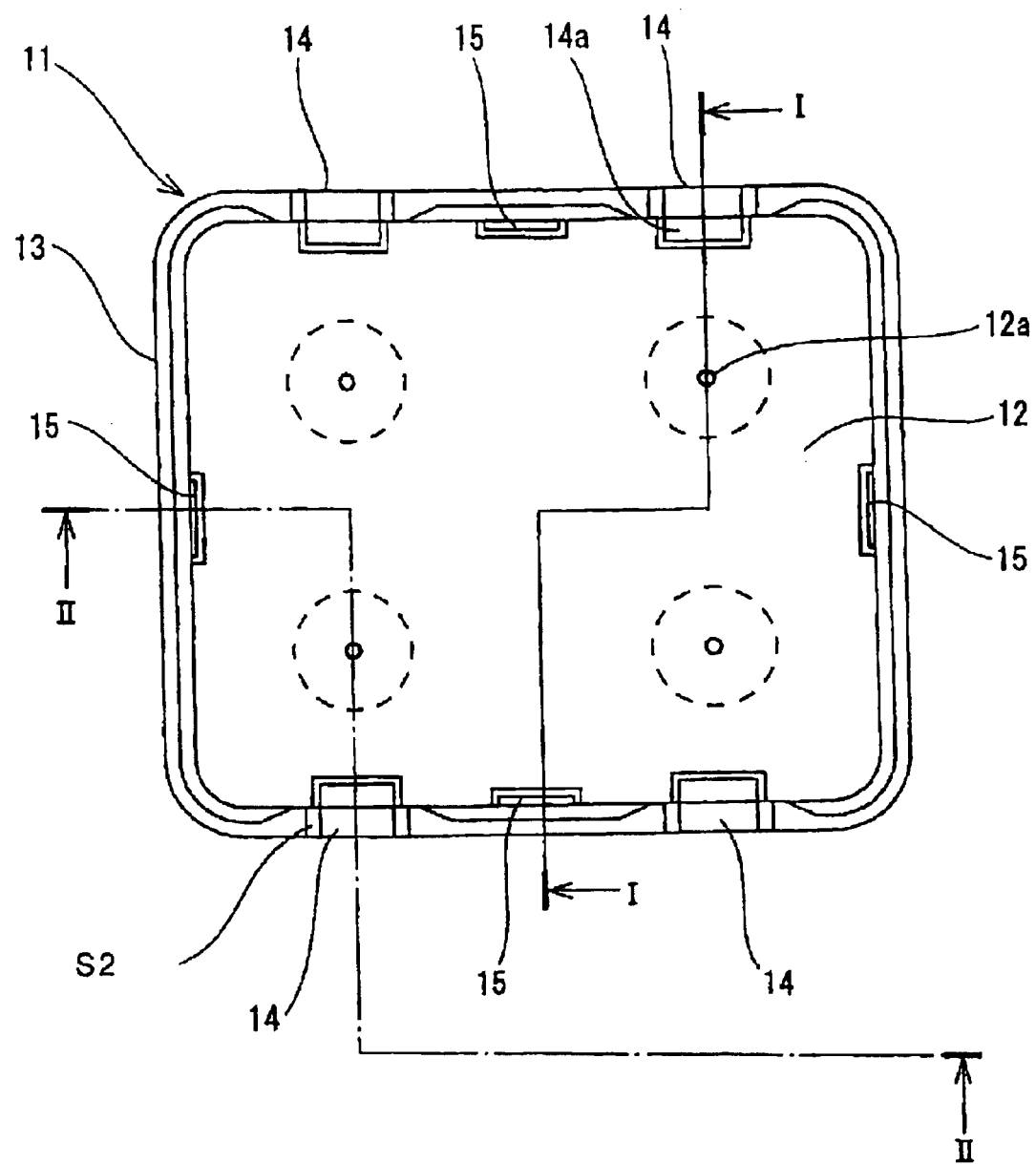
FIG. 2 is a plan view of an electronic component receptacle of the junction board shown in FIG. 1.
Figure 3:
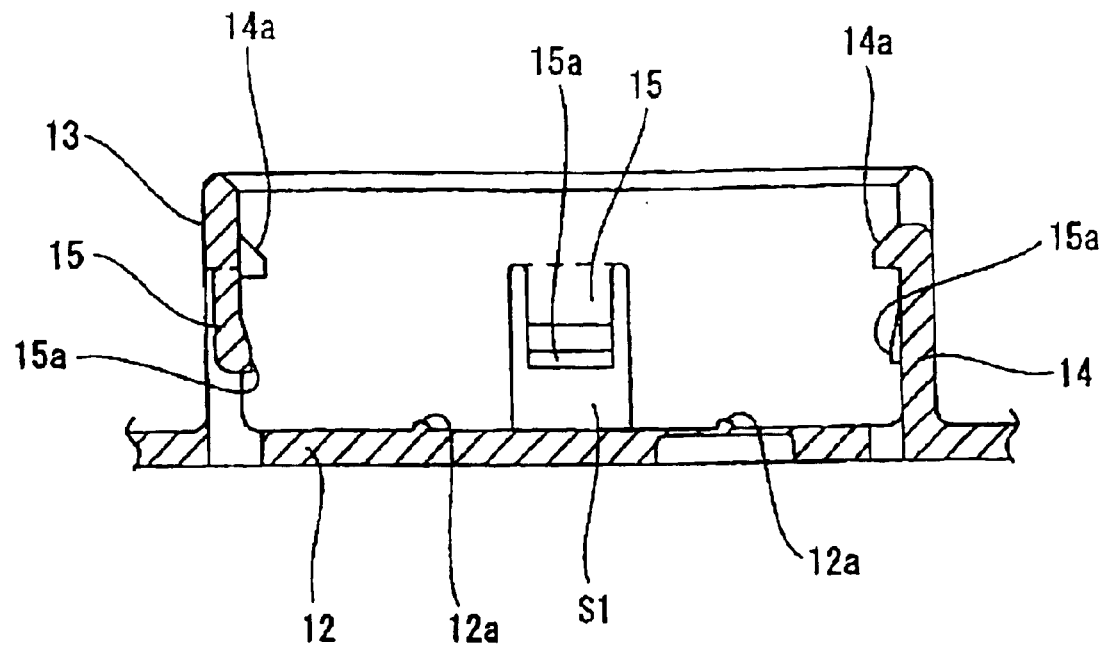
FIG. 3 is a cross sectional view taken along line I—I of FIG. 2.
Figure 4:
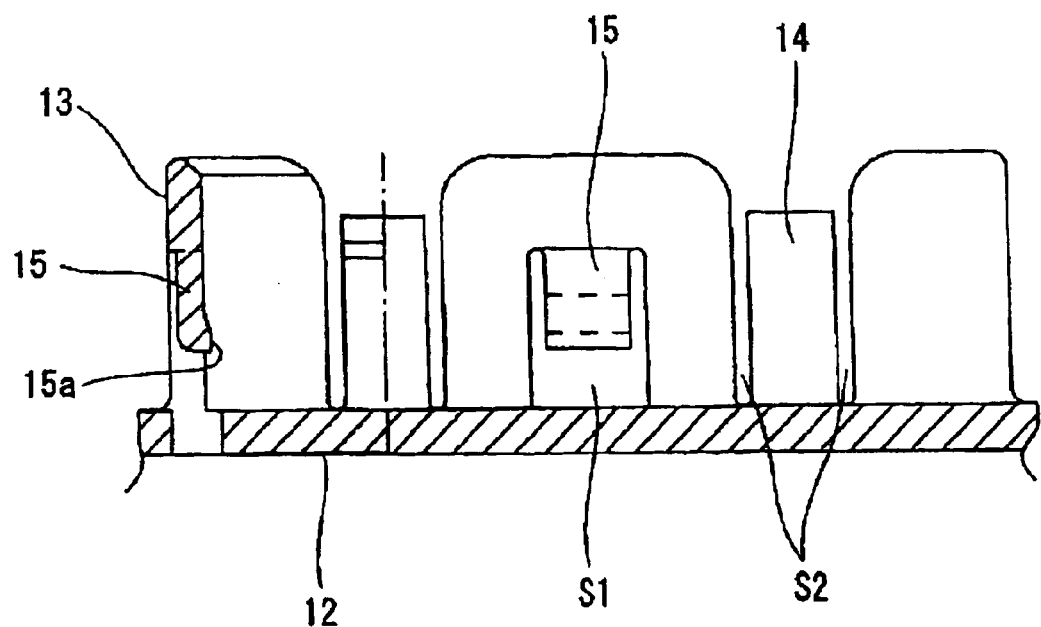
FIG. 4 is a cross sectional view along line II—II of FIG. 2.

FIGS. 2, 3, and 4 illustrate receptacle 11, which may have any suitable configuration, such as the form of a rectangular frame-like structure. Receptacle 11 includes first flexible fingers 14 and second flexible fingers 15, which may be formed in a sidewall 13 of receptacle 11. Each finger 14 may be formed by two slits S2 extending from the top of sidewall 13. Fingers 14 may be provided on each of two opposing sidewall portions of sidewall 13. Each finger 15 may be formed by a U-shaped cutout portion or space S1. Fingers 15 may be provided in the center of each of the four sidewall portions of sidewall 13.

The upper end of each finger 14 is able to flex freely in both inward and outward directions, and includes a hook portion 14a that protrudes toward the inner region of the receptacle 11. Hook portion 14a may be formed unitarily and in one piece with finger 14. The lower end of each finger 15 is able to flex freely in both inward and outward directions, and includes a lip portion 15a that protrudes toward the inner region of the receptacle 11. Lip portion 15a may be formed unitarily and in one piece with finger 15. Rib portions 12a are provided on a receptacle floor 12, and may be configured as four linear protrusions.

Figure 5:
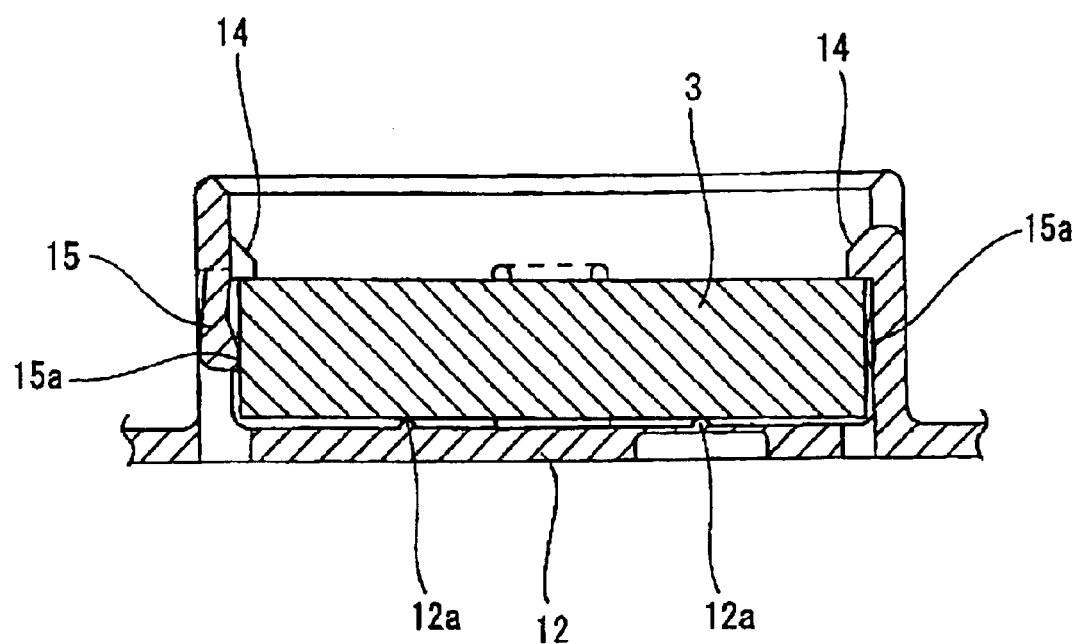
FIG. 5 is a cross sectional view of an electronic component installed in the receptacle shown in FIG. 2.
Figure 6A:
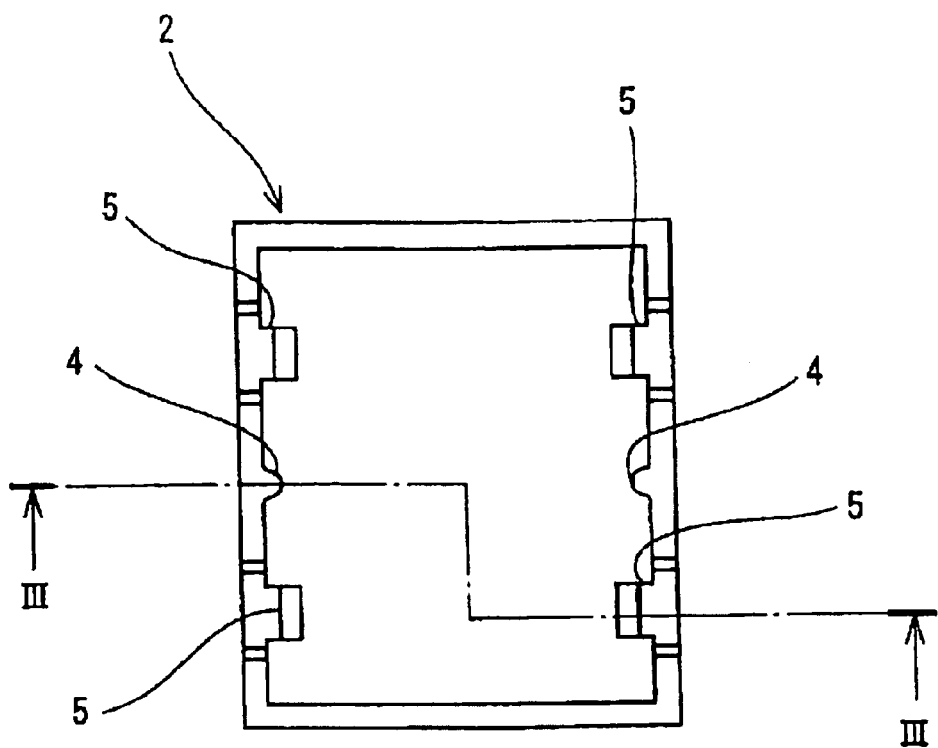
FIG. 6A is a plan view of a conventional component receptacle.
Figure 6B:
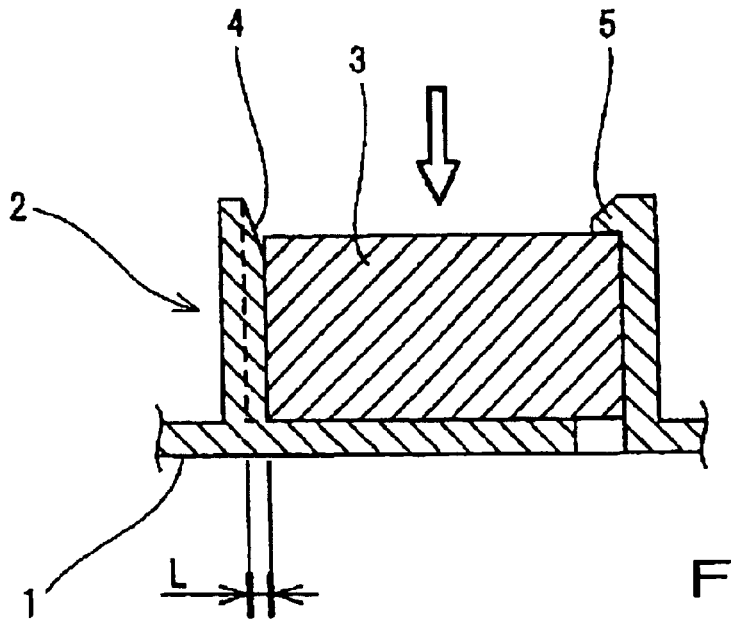
FIG. 6B is a cross sectional view taken along line III—III of FIG. 6A.

The downward insertion of a component 3 into a receptacle 11 initially causes hook portions 14a of fingers 14 to be pressed outwardly, thus causing fingers 14 to flex in the outward direction. Further insertion of component 3 presses lip portions 15a of fingers 15 outwardly, thus causing fingers 15 to also flex in the outward direction. At the point where the lower surface of component 3 comes into contact with rib portions 12a that protrude from receptacle floor 12, hook portions 14a flexibly return to their former positions, in which they overlap and press downward against the upper surface of component 3 which is now installed into receptacle 11 as shown in FIG. 5.

The bi-directional flexing of fingers 14, each of which includes an integral hook portion 14a for anchoring component 3, reduces the amount of pressure required to insert component 3 into receptacle 11. Moreover, the bi-directional flexing of fingers 15, each of which includes an integral lip portion 15a for preventing lateral vibration and rattling of component 3 within receptacle 11, also reduces the amount of pressure required to insert component 3 into receptacle 11.

Furthermore, should the dimensions of receptacle 11 fluctuate as a result of environmental factors, such as a change in temperature, the dimensional fluctuation can be accounted for by the elasticity of fingers 15 without adversely affecting the ability of fingers 15 to prevent component 3 from rattling and generating noise within receptacle 11. Moreover, fingers 15, which include lip portions 15a for preventing the vibration of component 3 within receptacle 11, may be provided on all four sides of receptacle 11 to prevent rattling movement of component 3 in the horizontal direction. Furthermore, component 3 is securely maintained within receptacle 11 by the pressure applied to the upper surface of component 3 by hook portions 14a of fingers 14.

The present invention reduces the pressure required to insert an electrical component into a junction board receptacle by providing a structure that includes a set of first flexible fingers to securely anchor the component within the receptacle, and a set of second flexible fingers to prevent movement of the component within the receptacle. Moreover, dimensional fluctuations caused by environmental factors, such as a change in temperature, can be accounted for by the elasticity of the flexible fingers without adversely affecting the ability of the fingers to prevent the component from vibrating and generating noise within the receptacle.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

The present disclosure relates to subject matter contained in priority Japanese Patent Application No. 2002-246206 filed on Aug. 27, 2002, which is herein expressly incorporated by reference in its entirety.

What is claimed:

1. An electronic component support structure comprising:
a component receptacle including a sidewall extending from a bottom surface of a synthetic resin junction board to form an inner space configured to contain an electronic component inserted therein;
a plurality of first flexible fingers, each of said first flexible fingers being formed by two slits provided at predetermined positions in the sidewall of said component receptacle, wherein a free end of each of said first flexible fingers is inwardly and outwardly flexible and includes an inwardly extending hook portion for pressing against an upper surface of the electronic component inserted into said component receptacle; and
a plurality of second flexible fingers, each of said second flexible fingers being formed by a U-shaped cutout portion provided at a predetermined position in the sidewall of said component receptacle, wherein a free end of each of said second flexible fingers is inwardly and outwardly flexible and includes an inwardly extending lip portion for pressing against a lateral surface of the electronic component inserted into said component receptacle.

2. The electronic component support structure according to claim 1, wherein the sidewall of said component receptacle includes four sidewall portions forming a rectangular structure, each of the sidewall portions including at least one of said second flexible fingers formed therein.

3. The electronic component support structure according to claim 2, wherein two opposed sidewall portions include at least one of said first flexible fingers formed therein.

4. The electronic component support structure according to claim 1, wherein the free ends of said first flexible fingers are upper free ends from which the hook portions inwardly extend.

5. The electronic component support structure according to claim 1, wherein the free ends of said second flexible fingers are lower free ends from which the lip portions inwardly extend.

6. The electronic component support structure according to claim 1, wherein the inwardly extending hook portions of said first flexible fingers maintain the electronic component in said component receptacle.

7. The electronic component support structure according to claim 1, wherein the inwardly extending lip portions of said second flexible fingers inhibit lateral movement of the electronic component in said component receptacle.

8. The electronic component support structure according to claim 1, wherein the bottom surface of the synthetic resin junction board includes at least one rib portion for engaging a lower surface of the electronic component in said component receptacle.

9. An electronic component support structure comprising:
a component receptacle including a sidewall extending from a bottom surface to form an inner space configured to contain an electronic component inserted therein;
at least one first flexible finger provided at a predetermined position in the sidewall of said component receptacle, wherein a free end of said at least one first flexible finger is inwardly and outwardly flexible and includes an inwardly extending hook portion for engaging an upper surface of the electronic component inserted into said component receptacle; and
at least one second flexible finger provided at a predetermined position in the sidewall of said component receptacle, wherein a free end of said at least one second flexible finger is inwardly and outwardly flexible and includes an inwardly extending lip portion for engaging a lateral surface of the electronic component inserted into said component receptacle.

10. The electronic component support structure according to claim 9, wherein the sidewall of said component receptacle includes four sidewall portions forming a rectangular structure, each of the sidewall portions including at least one of said at least one second flexible fingers formed therein.

11. The electronic component support structure according to claim 10, wherein two opposed sidewall portions of the sidewall each include at least one of said at least one first flexible fingers formed therein.

12. The electronic component support structure according to claim 9, wherein the free end of said at least one first flexible finger is an upper free end from which the hook portion inwardly extends.

13. The electronic component support structure according to claim 9, wherein the free end of said at least one second flexible finger is a lower free end from which the lip portion inwardly extends.

14. The electronic component support structure according to claim 9, wherein the inwardly extending hook portion of said at least one first flexible finger maintains the electronic component in said component receptacle.

15. The electronic component support structure according to claim 9, wherein the inwardly extending lip portion of said at least one second flexible finger inhibits lateral movement of the electronic component in said component receptacle.

16. The electronic component support structure according to claim 9, wherein the bottom surface from which the sidewall extends includes at least one rib portion for engaging a lower surface of the electronic component in said component receptacle.

17. The electronic component support structure according to claim 9, wherein a plurality of said at least one first flexible fingers are provided at predetermined positions along the sidewall.

18. The electronic component support structure according to claim 9, wherein a plurality of said at least one second flexible fingers are provided at predetermined positions along the sidewall.

19. The electronic component support structure according to claim 9, wherein said at least one first flexible finger is formed by two slits extending from a top edge of the sidewall.

20. The electronic component support structure according to claim 9, wherein said at least one second flexible finger is formed by a U-shaped cutout portion extending from a bottom edge of the sidewall.

\* \* \* \* \*